US006812566B2

United States Patent
Rabadam et al.

(10) Patent No.: US 6,812,566 B2
(45) Date of Patent: Nov. 2, 2004

(54) LOWER PROFILE PACKAGE WITH POWER SUPPLY IN PACKAGE

(75) Inventors: Eleanor P. Rabadam, Folsom, CA (US); Richard B. Foehringer, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 10/039,131

(22) Filed: Jan. 2, 2002

(65) Prior Publication Data

US 2003/0123239 A1 Jul. 3, 2003

(51) Int. Cl.[7] .............................................. H01L 23/58
(52) U.S. Cl. ...................... 257/724; 257/777; 361/782; 361/783; 438/109
(58) Field of Search ................................ 257/691, 723, 257/724, 777, 924; 361/760, 763, 782, 783; 327/536; 363/59, 60

(56) References Cited

U.S. PATENT DOCUMENTS

| | | | | |
|---|---|---|---|---|
| 4,803,610 A | * | 2/1989 | Gulczynski | .................. 363/70 |
| 5,239,198 A | * | 8/1993 | Lin et al. | .................... 257/693 |
| 5,798,567 A | | 8/1998 | Kelly et al. | |
| 5,939,866 A | * | 8/1999 | Bjorkengren | ............... 323/266 |
| 5,982,018 A | | 11/1999 | Wark et al. | |
| 6,040,622 A | * | 3/2000 | Wallace | ....................... 257/679 |
| 6,229,385 B1 | * | 5/2001 | Bell et al. | .................... 327/565 |
| 6,300,677 B1 | * | 10/2001 | Salem | ......................... 257/691 |
| 6,335,566 B1 | * | 1/2002 | Hirashima et al. | ........... 257/686 |
| 6,348,818 B1 | * | 2/2002 | Filipovski | .................... 327/108 |
| 6,356,453 B1 | * | 3/2002 | Juskey et al. | ................ 361/760 |
| 6,512,680 B2 | * | 1/2003 | Harada et al. | .............. 361/777 |
| 6,522,192 B1 | * | 2/2003 | Sander | ........................ 327/536 |
| 6,538,494 B2 | * | 3/2003 | Zimlich | ....................... 327/537 |
| 6,664,628 B2 | * | 12/2003 | Khandros et al. | ............ 257/723 |
| 2003/0038366 A1 | * | 2/2003 | Kozono | ........................ 257/723 |
| 2003/0089979 A1 | * | 5/2003 | Malinowski et al. | ........ 257/724 |

FOREIGN PATENT DOCUMENTS

WO    WO 01/39252 A2    5/2001

* cited by examiner

*Primary Examiner*—John B. Vigushin
(74) *Attorney, Agent, or Firm*—Trop, Pruner & Hu, P.C.

(57) ABSTRACT

A package with a Power Supply In Package (PSIP) feature may include a charge pump external to the die in order to take advantage of a smaller die size. The die may be mounted on a substrate with an array of solder balls of a Ball Grid Array. The package may have substantially the same size as a package without PSIP capability. In one embodiment, the passive components may be mounted on the die using epoxy. In another embodiment, the reduced-size passive components may be mounted on the substrate of the ball grid array in a region free of solder balls.

16 Claims, 1 Drawing Sheet

LOWER PROFILE PACKAGE WITH POWER SUPPLY IN PACKAGE

BACKGROUND

This invention relates generally to integrated circuits and particularly to designs for packaging an integrated circuit die.

An integrated circuit chip may be fabricated on a substrate, which may be a silicon wafer, by microelectronic processing. Typically, a multiplicity of chips (dice), separated by scribe lines, is formed simultaneously on a single wafer. Individual dice or chips are separated by dicing or sawing on the scribe lines.

Individual dice need to be electrically coupled to external circuitry. However, the dice are fragile and too small to handle easily. Further, they may also be vulnerable to contamination and corrosion by the environment, and subject to overheating during operation unless heat is dissipated. A die package provides the die with mechanical support, electrical connections, protection from contamination and corrosion, and heat dissipation during operation.

The process of packaging the die may include attachment of the die to the package, the bonding of wires from leads on the package to pads on the die, and encapsulation of the die for protection.

A Power Supply In Package (PSIP) design replaces capacitive charge pumps in a die with inductive charge pumps located outside the die, but still within the same package with the die. The resulting reduced die sizes reduce fabrication costs.

The external inductive charge pump includes discrete passive circuit elements such as inductors and capacitors that are included within the package with the die. As a result of the lack of integration of the charge pump into the die, the resulting package is generally larger. Thus, cost savings may be achieved, but the price may be larger package sizes.

The larger package size may be a problem in some applications. Designers may be hesitant to use PSIP parts because doing so may require re-design of the board layout to accommodate the larger package size. In some cases, extra board real estate may be difficult to come by.

Thus, there is a need for PSIP packages that substantially preserve non-PSIP form factors.

DETAILED DESCRIPTION

Figure 1:
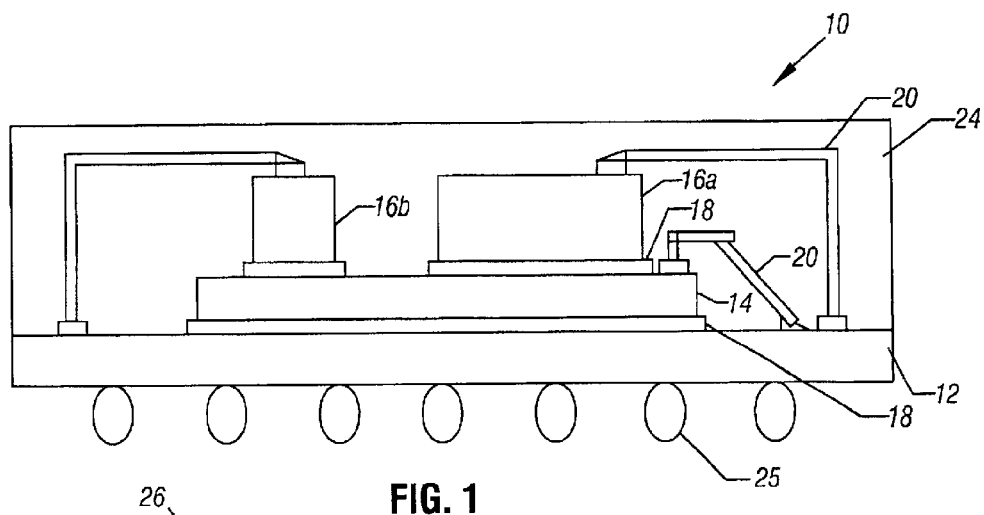
FIG. 1 is an enlarged cross-sectional view of a package for an integrated circuit in accordance with one embodiment of the present invention.

Referring to FIG. 1, a ball grid array (BGA) package 10 in accordance with one embodiment of the present invention may include a substrate 12 that may be electrically coupled to external circuitry using a multiplicity of solder balls 25. The package 10 may contain an integrated circuit die 14 attached to the substrate 12, for example using a suitable adhesive 18. In one embodiment, a set of low profile passive components 16a and 16b form a charge pump located externally of the die 14. The components 16a and 16b may be attached to the upper surface of the die 14, for example using the adhesive 18.

The charge pump components 16, may include inductors and capacitors. The adhesive 18 may be an epoxy adhesive. Further, since the charge pump components 16 are located in the package 10, albeit outside the die 14, the package may be Power Supply In Package (PSIP).

Wirebonds 20 provide electrical connections between the substrate 12 and the die 14 as well as between the substrate 12 and the passive components 16. A protective encapsulation 24 encapsulates the die 14 and components 16, forming a molded array package (MAP).

By using PSIP, a smaller die 14 size may be achieved. However, conventionally the package 10 size would exceed the form factor of a non-PSIP package including generally the same electrical devices because of the lack of integration of the components 16.

The package 10 may substantially maintain the form factor of a corresponding non-PSIP package so that the package 10 may fit within the space allocated on boards for corresponding non-PSIP packages that perform the same function. As a result a compact package 10 may be achieved that has lower costs while substantially maintaining the form factor of corresponding (but more expensive) non-PSIP packages.

The passive components 16 may be selected to have a height not exceeding 16 mils in some embodiments. The vertical profile of this package 10 may be further reduced, in some embodiments, by the use of BGA packaging technology which has a relatively low vertical profile compare to the pin grid array (PGA) packaging technique. The x, y size of the package may be reduced by the use of attachment methods such as user-dispensed epoxy as the adhesive 18 rather than surface mounting the passive components 16 to the substrate 12 beside the die 14.

Figure 2:
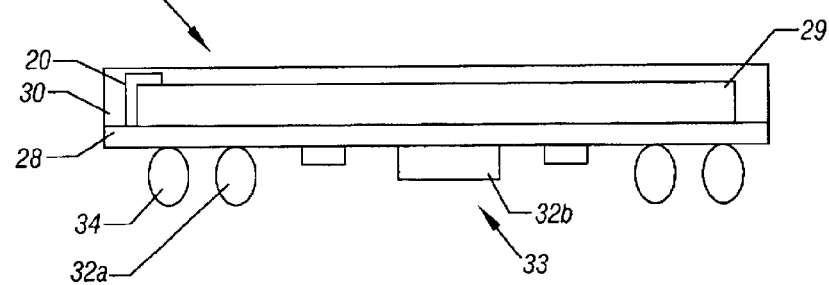
FIG. 2 is an enlarged cross-sectional view of a package for an integrated circuit in accordance with another embodiment of the present invention.

Referring to FIG. 2, in another PSIP embodiment, a ball grid array (BGA) package 26 may include an integrated circuit die 29 mounted on a substrate 28. The upper surface of the substrate 28 may be encapsulated using an encapsulation 30 in one example. The package 26 is electrically connected to external circuitry using a multiplicity of solder balls 34 disposed on the lower surface of the substrate 28. Passive components 32a and 32b including inductors and capacitors may form a charge pump located externally to and disposed beneath the die 29.

Figure 3:
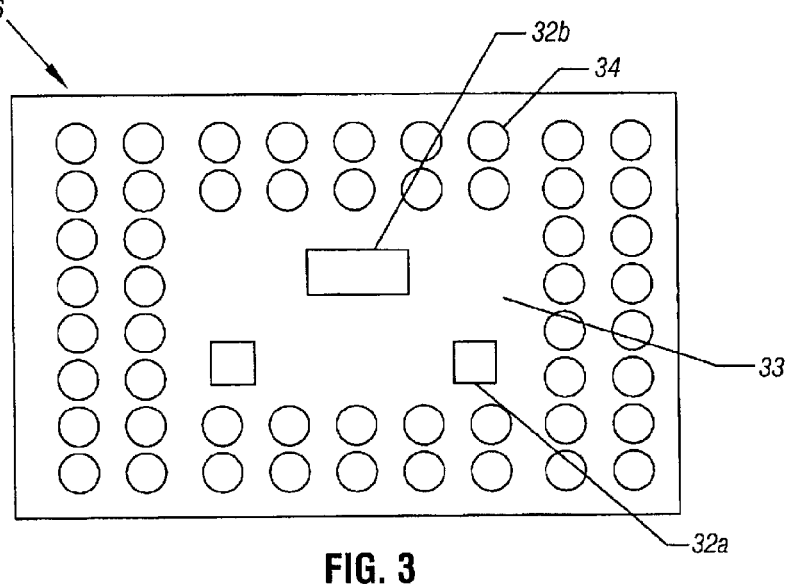
FIG. 3 is a bottom plan view of the embodiment shown in FIG. 2.

Referring to FIG. 3, the components 32 may be attached under the substrate 28 within a central field 33 that may be free of solder balls 34. Subsequently the package 26 is attached to external circuitry by surface mounting the solder balls 34.

In one embodiment the height of the passive components 32a and 32b does not exceed the height of the solder balls 34. As a result the passive components 32 may be included on the lower surface of the BGA substrate 28 without increasing the height of the package 26 from what it would have been if the passive components 32 were integrated inside the die 29. Thus the package 26 has the advantage of a smaller die 29 size because of its PSIP design while it still has substantially the same form factor.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A package for an electronic device comprising:
   a substrate;
   an integrated circuit die mounted on said substrate; and
   a charge pump including a passive component mounted on said die and electrically coupled to said die, wherein the extension of said component from said die is less than or equal to 16 mils.

2. The package of claim 1 including a ball grid array with multiple solder balls attached to said substrate.

3. The package of claim 2 wherein said component is adhesively attached to said die.

4. The package of claim 3 wherein said adhesive attachment is user-dispensed epoxy.

5. The package of claim 3 wherein said component and said die are electrically connected to said substrate using wire bonds.

6. The package of claim 1 wherein said component is an inductor.

7. The package of claim 1 wherein said component is a capacitor.

8. The package of claim 1 wherein said package is a molded array package.

9. The package of claim 1 wherein said package uses Power Supply In Package technology.

10. A method comprising:
    forming a substrate;
    mounting an integrated circuit die on said substrate; and
    forming a package with a charge pump coupled to said die in said package; and
    mounting a passive component on said die and electrically coupling said component to said die, so that the extension of said component from said die is less than or equal to 16 mils.

11. The method of claim 10 including attaching a ball grid array with multiple solder balls to said substrate.

12. The method of claim 11 including adhesively attaching said component to said die.

13. The method of claim 12 including using user-dispensed epoxy to adhesively attach said component.

14. The method of claim 13 including using wirebonds to electrically connect said component to said substrate and said die to said substrate.

15. The method of claim 10 including forming a molded array package.

16. The method of claim 10 including using Power Supply In Package technology.

* * * * *